United States Patent
Feng et al.

(10) Patent No.: US 10,551,419 B2
(45) Date of Patent: Feb. 4, 2020

(54) CAPACITANCE VALUE MEASUREMENT METHOD AND DEVICE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Xuehuan Feng, Beijing (CN); Yongqian Li, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 90 days.

(21) Appl. No.: 15/965,045

(22) Filed: Apr. 27, 2018

(65) Prior Publication Data

US 2019/0064240 A1    Feb. 28, 2019

(30) Foreign Application Priority Data

Aug. 31, 2017  (CN) .......................... 2017 1 0775353

(51) Int. Cl.
*G01R 27/26*    (2006.01)
*G09G 3/00*    (2006.01)
(Continued)

(52) U.S. Cl.
CPC ......... *G01R 27/2605* (2013.01); *G09G 3/006* (2013.01); *G09G 3/3225* (2013.01);
(Continued)

(58) Field of Classification Search
CPC .. G01R 27/26; G01R 27/2605; G01R 31/016; G01R 31/028; G01R 31/02639;
(Continued)

(56) References Cited

U.S. PATENT DOCUMENTS 5,235,272 A *  8/1993  Henley ............. G02F 1/136259
                                                     324/537
9,799,246 B2 * 10/2017  Chaji .................. G09G 3/3233
(Continued)

*Primary Examiner* — Son T Le
(74) *Attorney, Agent, or Firm* — Brooks Kushman P.C.

(57) ABSTRACT

A capacitance value measurement method and a capacitance value measurement device are provided. The capacitance value measurement method includes steps of: acquiring a first mapping relation; setting a standard temperature t0 of one analog-to-digital conversion circuit; and turning off all switching elements of a corresponding switching circuit other than an $A^{th}$ switching element, turning on the $A^{th}$ switching element, measuring a real-time temperature t of an analog-to-digital conversion sub-circuit of the analog-to-digital conversion circuit, measuring a real-time capacitance value Cn of an $n^{th}$ testing point, and acquiring a parasitic capacitance value of an external compensation sense line connected to the $A^{th}$ switching element at the real-time temperature t of the analog-to-digital conversion sub-circuit in accordance with the real-time capacitance value Cn and the first mapping relation, where A is a positive integer.

20 Claims, 4 Drawing Sheets

(51) Int. Cl.
*H03M 1/08* (2006.01)
*G09G 3/3225* (2016.01)
*G09G 3/3233* (2016.01)
*H03M 1/12* (2006.01)

(52) U.S. Cl.
CPC .......... *G09G 3/3233* (2013.01); *H03M 1/089* (2013.01); *G09G 2300/0819* (2013.01); *G09G 2300/0842* (2013.01); *G09G 2320/041* (2013.01); *H03M 1/12* (2013.01)

(58) Field of Classification Search
CPC ...... G09G 3/32; G09G 3/3233; G09G 3/3225; G09G 3/00; G09G 3/006; G09G 2300/0819; G09G 2300/0842; G09G 2320/041; H03M 1/08; H03M 1/089; H03M 1/12
See application file for complete search history.

(56) References Cited

U.S. PATENT DOCUMENTS

2009/0213148 A1* 8/2009 Takasugi .............. G09G 3/3233
345/690
2014/0062993 A1* 3/2014 Chaji ................... G09G 3/3225
345/212

* cited by examiner

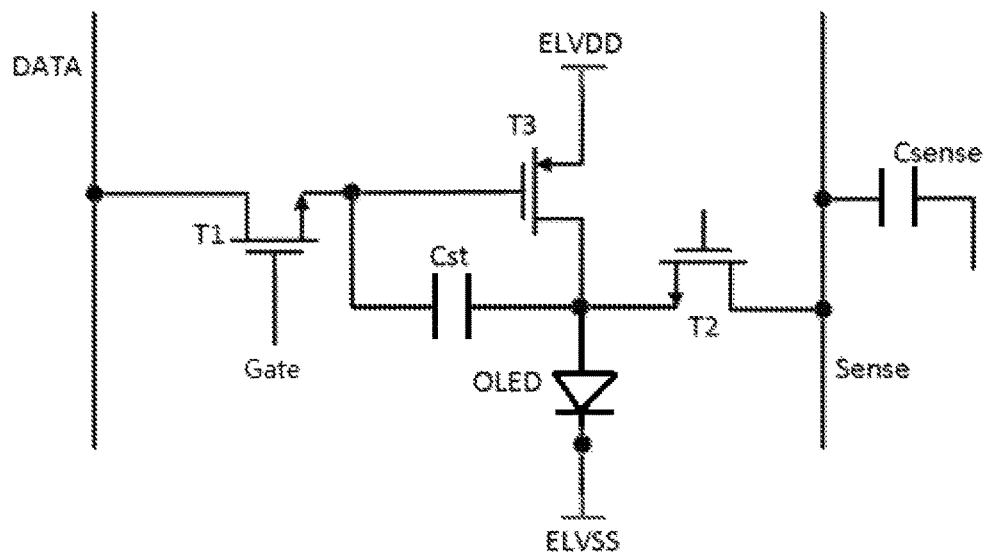

Fig. 1 acquiring a first mapping relation between a temperature of the $n^{th}$ analog-to-digital conversion circuit measured in advance and a parasitic capacitance value of the $n^{th}$ analog-to-digital conversion circuit — S1 setting a standard temperature t0 of one analog-to-digital conversion circuit — S2 turning off all of the switching elements of the $n^{th}$ switching circuit other than an $A^{th}$ switching element, turning on the $A^{th}$ switching element, measuring a real-time temperature t of an analog-to-digital conversion sub-circuit of the $n^{th}$ analog-to-digital conversion circuit, measuring a real-time capacitance value Cn of an $n^{th}$ testing point, and acquiring a parasitic capacitance value CsA of an external compensation sense line connected to the $A^{th}$ switching element at the real-time temperature t of the analog-to-digital conversion sub-circuit in accordance with the real-time capacitance value Cn and the first mapping relation; and the $n^{th}$ analog-to-digital conversion circuit being connected to a second end of each switching element of the $n^{th}$ switching circuit via a connection line connected to the $n^{th}$ testing point, where A being a positive integer — S3

Fig. 2

CAPACITANCE VALUE MEASUREMENT METHOD AND DEVICE

CROSS-REFERENCE TO RELATED APPLICATION

This application claims priority to Chinese Patent Application No. 201710775353.2 filed on Aug. 31, 2017, which is incorporated herein by reference in its entirety.

TECHNICAL FIELD

The present disclosure relates to the field of capacitance value measurement technology, in particular to a capacitance value measurement method and a capacitance value measurement device.

BACKGROUND

Organic light-emitting diode (OLED) display panel has attracted more and more attentions due to such advantages as high contrast, low power consumption and self-luminescence. For a pixel circuit in the related art, due to instability of thin film transistors (TFTs), the influence caused by the performance change of the TFTs needs to be taken into consideration, so usually a compensation circuit is adopted. In such compensation circuit, a capacitance value of an external compensation sense line measured indirectly is related to a parasitic capacitance value of an analog-to-digital conversion circuit, and the parasitic capacitance value of the analog-to-digital conversion circuit is relate to a temperature of the analog-to-digital conversion circuit. Hence, it is impossible for a capacitance value measurement method for the in the related art to acquire the parasitic capacitance value of the external compensation sense line in an accurate manner.

SUMMARY

In one aspect, the present disclosure provides in some embodiments a capacitance value measurement method for measuring a parasitic capacitance value of an external compensation sense line of a display device. The display device includes a display panel, a circuit board, N analog-to-digital conversion circuits, N switching circuits, and M external compensation sense lines arranged on the display panel, where each of N and M is a positive integer. An $n^{th}$ switching circuit of the N switching circuits is connected to an $n^{th}$ analog-to-digital conversion circuit of the N analog-to-digital conversion circuits. The $n^{th}$ switching circuit includes at least one switching element. A first end of one switching element of the $n^{th}$ switching circuit is connected to one of the external compensation sense lines, and a second end of the one switching element is connected to the $n^{th}$ analog-to-digital conversion circuit, where n is a positive integer smaller than or equal to N. The capacitance value measurement method includes steps of: acquiring a first mapping relation between a temperature of the $n^{th}$ analog-to-digital conversion circuit measured in advance and a parasitic capacitance value of the $n^{th}$ analog-to-digital conversion circuit; setting a standard temperature t0 of one of the analog-to-digital conversion circuits; and turning off all of the switching elements of the $n^{th}$ switching circuit other than an $A^{th}$ switching element, turning on the $A^{th}$ switching element, measuring a temperature t of a real-time analog-to-digital conversion sub-circuit of the $n^{th}$ analog-to-digital conversion circuit, measuring a real-time capacitance value Cn of an $n^{th}$ testing point, and acquiring a parasitic capacitance value CsA of the external compensation sense line connected to the $A^{th}$ switching element at the temperature t of the real-time analog-to-digital conversion sub-circuit in accordance with the real-time capacitance value Cn and the first mapping relation. The $n^{th}$ analog-to-digital conversion circuit is connected to a second end of each switching element of the $n^{th}$ switching circuit via a connection line on which the $n^{th}$ testing point is located, where A is a positive integer.

In a possible embodiment of the present disclosure, the step of acquiring the parasitic capacitance value CsA of the external compensation sense line connected to the $A^{th}$ switching element at the temperature t of the real-time analog-to-digital conversion sub-circuit in accordance with the real-time capacitance value Cn and the first mapping relation includes: acquiring a first parasitic capacitance value Cad1 of the $n^{th}$ analog-to-digital conversion circuit corresponding to the standard temperature t0 of the analog-to-digital conversion circuit in accordance with the first mapping relation, acquiring a difference ΔC1 between a second parasitic capacitance value of the $n^{th}$ analog-to-digital conversion circuit corresponding to the temperature t of the real-time analog-to-digital conversion sub-circuit and the first parasitic capacitance value Cad1, and determining that the parasitic capacitance value CsA of the external compensation sense line connected to the $A^{th}$ switching element at the temperature t of the real-time analog-to-digital conversion sub-circuit is equal to Cn−Cad1−ΔC1.

In a possible embodiment of the present disclosure, the display device further includes N detection capacitors arranged on the circuit board, a first end of an $n^{th}$ detection capacitor of the N detection capacitors is connected to the second ends of the switching elements of the $n^{th}$ switching circuit, and a second end of the $n^{th}$ detection capacitor is connected to a first level input end. The step of acquiring the parasitic capacitance value CsA of the external compensation sense line connected to the $A^{th}$ switching element at the temperature t of the real-time analog-to-digital conversion sub-circuit in accordance with the real-time capacitance value Cn and the first mapping relation includes: acquiring a first parasitic capacitance value Cad1 of the $n^{th}$ analog-to-digital conversion circuit corresponding to the standard temperature t0 of the analog-to-digital conversion circuit in accordance with the first mapping relation, acquiring a difference ΔC1 between a second parasitic capacitance value of the $n^{th}$ analog-to-digital conversion circuit corresponding to the temperature t of the real-time analog-to-digital conversion sub-circuit and the first parasitic capacitance value Cad1, and determining that the parasitic capacitance value CsA of the external compensation sense line connected to the $A^{th}$ switching element at the temperature t of the real-time analog-to-digital conversion sub-circuit is equal to Cn−Cad1−Cextn−ΔC1, where Cextn represents a capacitance value of the $n^{th}$ detection capacitor.

In a possible embodiment of the present disclosure, the step of turning off all of the switching elements of the $n^{th}$ switching circuit other than the $A^{th}$ switching element and turning on the $A^{th}$ switching element includes: turning on a plurality of switching elements of the $n^{th}$ switching circuit in a time-division manner; and in the case that one switching element of the $n^{th}$ switching circuit has been turned on, turning off all of the switching elements of the $n^{th}$ switching circuit other than the switching element that has been turned on. The standard temperature t0 of the analog-to-digital conversion circuit is a temperature of the $n^{th}$ analog-to-digital conversion circuit measured in the case that an $a^{th}$ switching element of the $n^{th}$ switching circuit has been turned on, a is a positive integer, and the $a^{th}$ switching element is a switching element of the $n^{th}$ switching circuit which is turned on prior to turning on any other one of the switching elements of the $n^{th}$ switching circuit.

In a possible embodiment of the present disclosure, the step of turning off all of the switching elements of the $n^{th}$ switching circuit other than the $A^{th}$ switching element and turning on the $A^{th}$ switching element includes: turning on a plurality of switching elements of the $n^{th}$ switching circuit sequentially in a time-division manner; and in the case that one switching element has been turned on, turning off all of the switching elements of the $n^{th}$ switching circuit other than the one switching element that has been turned on. The standard temperature t0 of the analog-to-digital conversion circuit is a temperature of the $n^{th}$ analog-to-digital conversion circuit measured in the case that a first switching element of the $n^{th}$ switching circuit has been turned on.

In a possible embodiment of the present disclosure, the step of acquiring the first mapping relation between the temperature of the $n^{th}$ analog-to-digital conversion circuit measured in advance and the parasitic capacitance value of the $n^{th}$ analog-to-digital conversion circuit includes: turning off all of the switching elements of the $n^{th}$ switching element, measuring the real-time capacitance values of the $n^{th}$ testing point in the case that the $n^{th}$ analog-to-digital conversion circuit is at different temperatures, determining the real-time capacitance values as the parasitic capacitance values of the $n^{th}$ analog-to-digital conversion circuit at different temperatures, and acquiring the first mapping relation between the temperature of the $n^{th}$ analog-to-digital conversion circuit and the parasitic capacitance value of the $n^{th}$ analog-to-digital conversion circuit in accordance with the parasitic capacitance values and the corresponding temperatures.

In a possible embodiment of the present disclosure, the step of acquiring the first mapping relation between the temperature of the $n^{th}$ analog-to-digital conversion circuit measured in advance and the parasitic capacitance value of the $n^{th}$ analog-to-digital conversion circuit includes: turning off all of the switching elements of the $n^{th}$ switching element, measuring the real-time capacitance values of the $n^{th}$ testing point in the case that the $n^{th}$ analog-to-digital conversion circuit is at different temperatures, determining differences between the real-time capacitance values and the capacitance value of the $n^{th}$ detection capacitor as the parasitic capacitance values of the $n^{th}$ analog-to-digital conversion circuit at different temperatures, and acquiring the first mapping relation between the temperature of the $n^{th}$ analog-to-digital conversion circuit and the parasitic capacitance value of the $n^{th}$ analog-to-digital conversion circuit in accordance with the parasitic capacitance values and the corresponding temperatures.

In a possible embodiment of the present disclosure, the capacitance value measurement method further includes: setting a standard temperature of the display panel corresponding to the external compensation sense line connected to the $A^{th}$ switching element of the $n^{th}$ switching circuit; acquiring a capacitance difference between a parasitic capacitance value of the corresponding external compensation sense line measured at a real-time temperature of the display panel and a parasitic capacitance value of the corresponding external compensation sense line at the standard temperature of the display panel, and acquiring a second mapping relation between the capacitance difference and the real-time temperature of the display panel; and measuring a real-time temperature t1 at a position on the display panel spaced apart from the corresponding external compensation sense line by a distance within a predetermined range, and determining that a parasitic capacitance value C0 of the corresponding external compensation sense line at the standard temperature of the display panel is equal to $CsA-\Delta C2$, where $\Delta C2$ represents a capacitance difference corresponding to the real-time temperature t1 acquired in accordance with the second mapping relation.

In another aspect, the present disclosure provides in some embodiments a capacitance value measurement device for measuring a parasitic capacitance value of an external compensation sense line of a display device. The display device includes a display panel, a circuit board, N analog-to-digital conversion circuits, N switching circuits, and M external compensation sense lines arranged on the display panel, where each of N and M is a positive integer. An $n^{th}$ switching circuit of the N switching circuits is connected to an $n^{th}$ analog-to-digital conversion circuit of the N analog-to-digital conversion circuits. The $n^{th}$ switching circuit includes at least one switching element. A first end of one switching element of the $n^{th}$ switching circuit is connected to one of the external compensation sense lines, and a second end of the one switching element is connected to the $n^{th}$ analog-to-digital conversion circuit, where n is a positive integer smaller than or equal to N. The capacitance value measurement device includes: a first mapping relation acquisition circuit configured to acquire a first mapping relation between a temperature of the $n^{th}$ analog-to-digital conversion circuit measured in advance and a parasitic capacitance value of the $n^{th}$ analog-to-digital conversion circuit; a first setting circuit configured to set a standard temperature t0 of one of the analog-to-digital conversion circuits; a switching control circuit configured to turn off all of the switching elements of the $n^{th}$ switching circuit other than an $A^{th}$ switching element, and turn on the $A^{th}$ switching element; a first temperature measurement circuit configured to measure a real-time temperature t of an analog-to-digital conversion sub-circuit of the $n^{th}$ analog-to-digital conversion circuit; a capacitance value measurement circuit configured to measure a real-time capacitance value Cn of an $n^{th}$ testing point; and a first parasitic capacitance value determination circuit configured to acquire a parasitic capacitance value CsA of the external compensation sense line connected to the $A^{th}$ switching element at the real-time temperature t of the analog-to-digital conversion sub-circuit in accordance with the real-time capacitance value Cn and the first mapping relation. The $n^{th}$ analog-to-digital conversion circuit is connected to a second end of each switching element of the $n^{th}$ switching circuit via a connection line on which the $n^{th}$ testing point is located, where A is a positive integer.

In a possible embodiment of the present disclosure, the capacitance value measurement device further includes at least one analog-to-digital conversion chip. The $n^{th}$ analog-to-digital conversion circuit and the $n^{th}$ switching circuit are arranged on the analog-to-digital conversion chip, or the $n^{th}$ analog-to-digital conversion circuit is arranged on the analog-to-digital conversion chip and the $n^{th}$ switching circuit is arranged on the display panel.

In a possible embodiment of the present disclosure, the first parasitic capacitance value determination circuit is further configured to acquire a first parasitic capacitance value Cad1 of the $n^{th}$ analog-to-digital conversion circuit corresponding to the standard temperature t0 of the analog-to-digital conversion circuit in accordance with the first mapping relation, acquire a difference $\Delta C1$ between a second parasitic capacitance value of the $n^{th}$ analog-to-digital conversion circuit corresponding to the real-time temperature t of the analog-to-digital conversion sub-circuit and the first parasitic capacitance value Cad1, and determine that the parasitic capacitance value CsA of the external compensation sense line connected to the $A^{th}$ switching element at the real-time temperature t of the analog-to-digital conversion sub-circuit is equal to Cn−Cad1−ΔC1.

In a possible embodiment of the present disclosure, the display device further includes N detection capacitors arranged on the circuit board, a first end of an $n^{th}$ detection capacitor of the N detection capacitors is connected to the second ends of the switching elements of the $n^{th}$ switching circuit, and a second end of the $n^{th}$ detection capacitor is connected to a first level input end. The first parasitic capacitance value determination circuit is further configured to acquire a first parasitic capacitance value Cad1 of the $n^{th}$ analog-to-digital conversion circuit corresponding to the standard temperature t0 of the analog-to-digital conversion circuit in accordance with the first mapping relation, acquire a difference ΔC1 between a second parasitic capacitance value of the $n^{th}$ analog-to-digital conversion circuit corresponding to the real-time temperature t of the analog-to-digital conversion sub-circuit and the first parasitic capacitance value Cad1, and determine that the parasitic capacitance value CsA of the external compensation sense line connected to the $A^{th}$ switching element at the real-time temperature t of the analog-to-digital conversion sub-circuit is equal to Cn−Cad1−Cextn−ΔC1, where Cextn represents a capacitance value of the $n^{th}$ detection capacitor.

In a possible embodiment of the present disclosure, the switching control circuit is further configured to: turn on a plurality of switching elements of the $n^{th}$ switching circuit in a time-division manner; and in the case that one switching element of the $n^{th}$ switching circuit has been turned on by the switching control circuit, turn off all of the switching elements of the $n^{th}$ switching circuit other than the switching element that has been turned on. The standard temperature t0 of the analog-to-digital conversion circuit is a temperature of the $n^{th}$ analog-to-digital conversion circuit measured in the case that an $a^{th}$ switching element of the $n^{th}$ switching circuit has been turned on, a is a positive integer, and the $a^{th}$ switching element is a switching element of the $n^{th}$ switching circuit which is turned on prior to turning on any other one of the switching elements of the $n^{th}$ switching circuit.

In a possible embodiment of the present disclosure, the switching control circuit is further configured to: turn on a plurality of switching elements of the $n^{th}$ switching circuit sequentially in a time-division manner; and in the case that one switching element of the $n^{th}$ switching circuit has been turned on by the switching control circuit, turn off all of the switching elements of the $n^{th}$ switching circuit other than the switching element that has been turned on. The standard temperature t0 of the analog-to-digital conversion circuit is a temperature of the $n^{th}$ analog-to-digital conversion circuit measured in the case that a first switching element of the $n^{th}$ switching circuit has been turned on.

In a possible embodiment of the present disclosure, the capacitance value measurement device further includes a first mapping relation detection circuit. The first mapping relation detection circuit includes: a second control circuit configured to turn off all of the switching elements of the $n^{th}$ switching element; a real-time capacitance value measurement circuit configured to measure the real-time capacitance values of the $n^{th}$ testing point in the case that the $n^{th}$ analog-to-digital conversion circuit is at different temperatures; a parasitic capacitance value determination circuit configured to determine the real-time capacitance values as the parasitic capacitance values of the $n^{th}$ analog-to-digital conversion circuit at different temperatures; and a first mapping relation detection circuit configured to acquire the first mapping relation between the temperature of the $n^{th}$ analog-to-digital conversion circuit and the parasitic capacitance value of the $n^{th}$ analog-to-digital conversion circuit in accordance with the parasitic capacitance values and the corresponding temperatures.

In a possible embodiment of the present disclosure, the capacitance value measurement device further includes a first mapping relation detection circuit. The first mapping relation detection circuit includes: a second control circuit configured to turn off all of the switching elements of the $n^{th}$ switching element; a real-time capacitance value measurement circuit configured to measure the real-time capacitance values of the $n^{th}$ testing point in the case that the $n^{th}$ analog-to-digital conversion circuit is at different temperatures; a parasitic capacitance value determination circuit configured to determine differences between the real-time capacitance values and the capacitance value of the $n^{th}$ detection capacitor as the parasitic capacitance values of the $n^{th}$ analog-to-digital conversion circuit at different temperatures; and a first mapping relation detection circuit configured to acquire the first mapping relation between the temperature of the $n^{th}$ analog-to-digital conversion circuit and the parasitic capacitance value of the $n^{th}$ analog-to-digital conversion circuit in accordance with the parasitic capacitance values and the corresponding temperatures.

In a possible embodiment of the present disclosure, the capacitance value measurement device further includes: a second setting circuit configured to set a standard temperature of the display panel corresponding to the external compensation sense line connected to the $A^{th}$ switching element of the $n^{th}$ switching circuit; a second mapping relation acquisition circuit configured to acquire a capacitance difference between a parasitic capacitance value of the corresponding external compensation sense line measured at a real-time temperature of the display panel and a parasitic capacitance value of the corresponding external compensation sense line at the standard temperature of the display panel, and acquire a second mapping relation between the capacitance difference and the real-time temperature of the display panel; a second temperature measurement circuit configured to measure a real-time temperature t1 at a position on the display panel spaced apart from the corresponding external compensation sense line by a distance within a predetermined range; and a second parasitic capacitance value determination circuit configured to determine that a parasitic capacitance value C0 of the corresponding external compensation sense line at the standard temperature of the display panel is equal to CsA−ΔC2, where ΔC2 represents a capacitance difference corresponding to the real-time temperature t1 acquired in accordance with the second mapping relation.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

FIG. 1 is a circuit diagram of a 3T1C-mode compensation circuit in related art;

FIG. 2 is a flow chart of a capacitance value measurement method according to one embodiment of the present disclosure;

DETAILED DESCRIPTION

Figure 3:
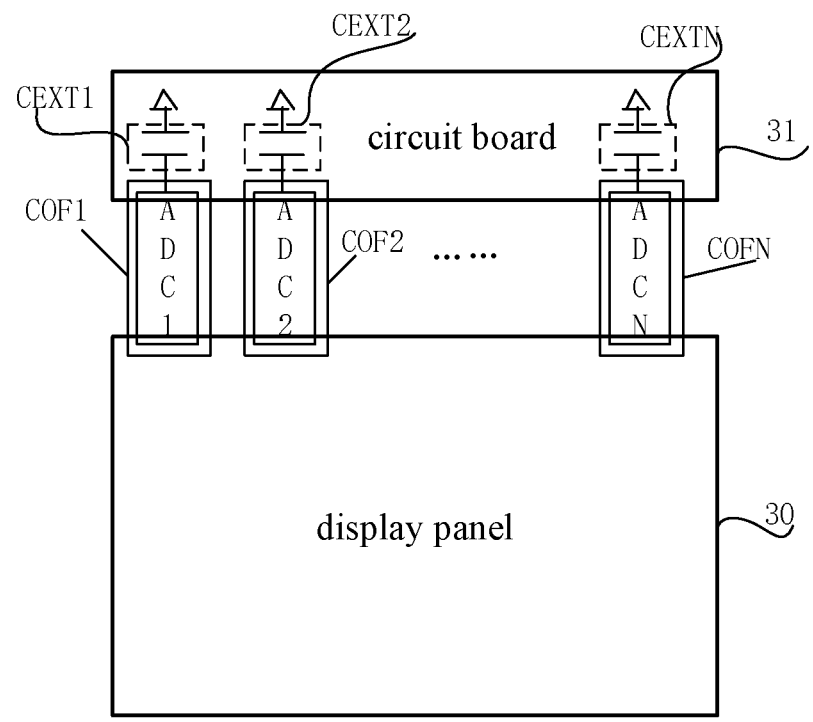
FIG. 3 is a schematic view showing a display device to which the capacitance value measurement method is applied according to one embodiment of the present disclosure.

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relation, and when an absolute position of the object is changed, the relative position relation will be changed too.

As shown in FIG. 1, a 3T1C-mode compensation circuit in the related art includes a switching TFT T1, a driving TFT T3, a detection TFT T2 and a storage capacitor Cst. In FIG. 1, the reference sign "OLED" represents an organic light-emitting diode, the reference sign "DATA" represents a data line, the reference sign "Gate" represents a gate line, the reference sign "Sense" represents an external compensation sense line, the reference sign "Csense" represents a parasitic capacitance of the external compensation sense line, the reference sign "ELVDD" represents a high power source voltage, and the reference sign "ELVSS" represents a low power source voltage. At a detection stage, it is necessary to charge the external compensation sense line in a floating state, then a voltage across the external compensation sense line is detected through an analog-to-digital conversion circuit, and then a current flowing through the driving transistor T3 is calculated in accordance with the voltage. During the calculation, the parasitic capacitance value of the external compensation sense line needs to be taken into consideration. However, due to the external compensation sense line arranged on a display panel, so it is impossible to directly measure the parasitic capacitance value of the external compensation sense line.

All transistors adopted in the embodiments of the present disclosure may be TFTs, field effect transistors (FETs) or any other elements having an identical characteristic. In the embodiments of the present disclosure, in order to differentiate two electrodes of a transistor other than a gate electrode of the transistor from each other, one of the two electrodes is called as a first electrode and the other one is called as a second electrode. In actual use, the first electrode may be a drain electrode while the second electrode may be a source electrode, or the first electrode may be a source electrode while the second electrode may be a drain electrode.

The present disclosure provides in some embodiments a capacitance value measurement method for measuring a parasitic capacitance value of an external compensation sense line of a display device. The display device includes a display panel, a circuit board, N analog-to-digital conversion circuits, N switching circuits, and M external compensation sense lines arranged on the display panel, where each of N and M is a positive integer. An $n^{th}$ switching circuit of the N switching circuits is connected to an $n^{th}$ analog-to-digital conversion circuit of the N analog-to-digital conversion circuits. The $n^{th}$ switching circuit includes at least one switching element. A first end of one switching element of the $n^{th}$ switching circuit is connected to one of the external compensation sense lines, and a second end of the one switching element is connected to the $n^{th}$ analog-to-digital conversion circuit, where n is a positive integer smaller than or equal to N.

As shown in FIG. 2, the capacitance value measurement method includes: S1 of acquiring a first mapping relation between a temperature of the $n^{th}$ analog-to-digital conversion circuit measured in advance and a parasitic capacitance value of the $n^{th}$ analog-to-digital conversion circuit; S2 of setting a standard temperature t0 of one of the analog-to-digital conversion circuits; and S3 of turning off all of the switching elements of the $n^{th}$ switching circuit other than an $A^{th}$ switching element, turning on the $A^{th}$ switching element, measuring a real-time temperature t of an analog-to-digital conversion sub-circuit of the $n^{th}$ analog-to-digital conversion circuit, measuring a real-time capacitance value Cn of an $n^{th}$ testing point, and acquiring a parasitic capacitance value CsA of the external compensation sense line connected to the $A^{th}$ switching element at the real-time temperature t of the analog-to-digital conversion sub-circuit in accordance with the real-time capacitance value Cn and the first mapping relation. The $n^{th}$ analog-to-digital conversion circuit is connected to a second end of each switching element of the $n^{th}$ switching circuit via a connection line on which the $n^{th}$ testing point is located, where A is a positive integer.

According to the capacitance value measurement method in the embodiments of the present disclosure, the first mapping relation between the temperature of the $n^{th}$ analog-to-digital conversion circuit measured in advance and the parasitic capacitance value of the $n^{th}$ analog-to-digital conversion circuit is acquired, and then the parasitic capacitance value of the external compensation sense line connected to the $n^{th}$ analog-to-digital conversion circuit is accurately acquired in accordance with the first mapping relation, the measured real-time capacitance value Cn of the $n^{th}$ testing point, and the real-time temperature t of the analog-to-digital conversion sub-circuit of the $n^{th}$ analog-to-digital conversion circuit. As a result, it is able to accurately measure an actual parasitic capacitance value of the external compensation sense line in accordance with the influences of the different real-time temperatures of the analog-to-digital conversion sub-circuit on the parasitic capacitance value of the analog-to-digital conversion circuit.

In addition, a lookup table (i.e., the first mapping relation) may be established in accordance with relation between the measured temperature and the parasitic capacitance value of the analog-to-digital conversion circuit, and different parasitic capacitance values of the analog-to-digital conversion circuit are written with respect to different temperatures. As a result, it is able to accurately measure the parasitic capacitance value of the external compensation sense line, thereby to effectively prevent the occurrence of various display defects due to an inaccurate measurement value of the parasitic capacitance value of the external compensation sense line.

In actual use, depending on a size of the display panel, N may be 1, i.e., the display device may merely include one analog-to-digital conversion circuit and one switching circuit. The analog-to-digital conversion circuit may include a plurality of analog-to-digital conversion sub-circuits (each analog-to-digital conversion sub-circuit may be arranged on an analog-to-digital conversion chip, which is arranged between the display panel and the circuit board). The switching circuit includes a plurality of switching elements. A first end of one switching element is connected to one external compensation sense line, and second ends of the plurality of switching elements are connected to the analog-to-digital conversion circuit. In addition, merely one testing point is provided with respect to the analog-to-digital conversion circuit. The analog-to-digital conversion circuit is connected to the second ends of the plurality of switching elements via a connection line on which the testing point is located. Alternatively, the display device may include a plurality of analog-to-digital conversion circuits and a plurality of switching circuits. Each analog-to-digital conversion circuit may include one analog-to-digital conversion sub-circuit arranged on an analog-to-digital conversion chip, and the analog-to-digital conversion chip may be arranged between the display panel and the circuit board. One of the switching circuits is connected to a corresponding analog-to-digital conversion circuit, and the switching circuit may include at least one switching element, and the switching circuit may be arranged on the analog-to-digital conversion chip or on the display panel of the display device. One testing point is provided with respect to each analog-to-digital conversion circuit. The $n^{th}$ analog-to-digital conversion circuit is connected to the second end of each of the plurality of switching elements of the $n^{th}$ switching circuit via a connection line on which the $n^{th}$ testing point is located. The $n^{th}$ testing point is arranged with respect to the $n^{th}$ analog-to-digital conversion circuit.

To be specific, the step of acquiring the parasitic capacitance value CsA of the external compensation sense line connected to the $A^{th}$ switching element at the real-time temperature t of the analog-to-digital conversion sub-circuit in accordance with the real-time capacitance value Cn and the first mapping relation includes: acquiring a first parasitic capacitance value Cad1 of the $n^{th}$ analog-to-digital conversion circuit corresponding to the standard temperature t0 of the analog-to-digital conversion circuit in accordance with the first mapping relation, acquiring a difference ΔC1 between a second parasitic capacitance value of the $n^{th}$ analog-to-digital conversion circuit corresponding to the real-time temperature t of the analog-to-digital conversion sub-circuit and the first parasitic capacitance value Cad1, and determining that the parasitic capacitance value CsA of the external compensation sense line connected to the $A^{th}$ switching element at the real-time temperature t of the analog-to-digital conversion sub-circuit is equal to Cn−Cad1−ΔC1.

According to the embodiments of the present disclosure, it is able to eliminate the influence of the temperature on the parasitic capacitance value of the analog-to-digital conversion circuit and accurately measure the parasitic capacitance value of the external compensation sense line, thereby to effectively prevent the occurrence of the display defects caused by the inaccurate measurement value of the parasitic capacitance of the external compensation sense line.

In actual use, a plurality of detection capacitors may be also arranged on the circuit board in accordance with the practical need.

During the implementation, the display device may further include N detection capacitors arranged on the circuit board. An $n^{th}$ detection capacitor corresponds to an $n^{th}$ analog-to-digital conversion chip. A first end of the $n^{th}$ detection capacitor is connected to the second ends of the plurality of switching elements of the $n^{th}$ switching circuit, and a second end of the $n^{th}$ detection capacitor is connected to a first level input end. At this time, the step of acquiring the parasitic capacitance value CsA of the external compensation sense line connected to the $A^{th}$ switching element at the real-time temperature t of the analog-to-digital conversion sub-circuit in accordance with the real-time capacitance value Cn and the first mapping relation includes: acquiring a first parasitic capacitance value Cad1 of the $n^{th}$ analog-to-digital conversion circuit corresponding to the standard temperature t0 of the analog-to-digital conversion circuit in accordance with the first mapping relation, acquiring a difference ΔC1 between a second parasitic capacitance value of the $n^{th}$ analog-to-digital conversion circuit corresponding to the real-time temperature t of the analog-to-digital conversion sub-circuit and the first parasitic capacitance value Cad1, and determining that the parasitic capacitance value CsA of the external compensation sense line connected to the $A^{th}$ switching element at the real-time temperature t of the analog-to-digital conversion sub-circuit is equal to Cn−Cad1−Cextn−ΔC1, where Cextn represents a capacitance value of the $n^{th}$ detection capacitor.

According to the embodiments of the present disclosure, it is able to eliminate the influence of the temperature on the parasitic capacitance value of the analog-to-digital conversion circuit and accurately measure the parasitic capacitance value of the external compensation sense line, thereby to effectively prevent the occurrence of the display defects caused by the inaccurate measurement value of the parasitic capacitance value of the external compensation sense line.

To be specific, the step of turning off all of the switching elements of the $n^{th}$ switching circuit other than the $A^{th}$ switching element and turning on the $A^{th}$ switching element may include: turning on a plurality of switching elements of the $n^{th}$ switching circuit in a time-division manner; and in the case that one switching element of the $n^{th}$ switching circuit has been turned on, turning off all of the switching elements of the $n^{th}$ switching circuit other than the switching element that has been turned on. The standard temperature t0 of the analog-to-digital conversion circuit is a temperature of the $n^{th}$ analog-to-digital conversion circuit measured in the case that an $a^{th}$ switching element of the $n^{th}$ switching circuit has been turned on, a is a positive integer, and the $a^{th}$ switching element is a switching element of the $n^{th}$ switching circuit which is turned on prior to turning on any other one of the switching elements of the $n^{th}$ switching circuit.

In actual use, it is necessary to determine at first the temperature of the analog-to-digital conversion circuit in the case that one switching element has been turned on as the standard temperature, and then turn on the plurality of switching element of the switching circuit in a time-division manner, so as to measure the parasitic capacitance values of the corresponding external compensation sense lines sequentially.

In a possible embodiment of the present disclosure, the step of turning off all of the switching elements of the $n^{th}$ switching circuit other than the $A^{th}$ switching element and turning on the $A^{th}$ switching element may include: turning on a plurality of switching elements of the $n^{th}$ switching circuit sequentially in a time-division manner; and in the case that one switching element has been turned on, turning off all of the switching elements of the $n^{th}$ switching circuit other than the switching element that has been turned on. The standard temperature t0 of the analog-to-digital conversion circuit is a temperature of the $n^{th}$ analog-to-digital conversion circuit measured in the case that a first switching element of the $n^{th}$ switching circuit has been turned on.

In actual use, the plurality of switching elements of the switching circuit may be turned on sequentially, and the temperature of the analog-to-digital conversion circuit in the case that the first switching element has been turned on may be set as the standard temperature.

During the implementation, the step of acquiring the first mapping relation between the temperature of the $n^{th}$ analog-to-digital conversion circuit measured in advance and the parasitic capacitance value of the $n^{th}$ analog-to-digital conversion circuit includes: turning off all of the switching elements of the $n^{th}$ switching element, measuring the real-time capacitance values of the $n^{th}$ testing point in the case that the $n^{th}$ analog-to-digital conversion circuit is at different temperatures, determining the real-time capacitance values as the parasitic capacitance values of the $n^{th}$ analog-to-digital conversion circuit at different temperatures, and acquiring the first mapping relation between the temperature of the $n^{th}$ analog-to-digital conversion circuit and the parasitic capacitance value of the $n^{th}$ analog-to-digital conversion circuit in accordance with the parasitic capacitance values and the corresponding temperatures. In actual use, the first mapping relation may be acquired through measuring the parasitic capacitance values of the $n^{th}$ analog-to-digital conversion circuit at different temperatures.

During the implementation, the display device may further include N detection capacitors arranged on the circuit board. An $n^{th}$ detection capacitor corresponds to the $n^{th}$ analog-to-digital conversion circuit. A first end of the $n^{th}$ detection capacitor is connected to the second ends of the plurality of switching elements of the $n^{th}$ switching circuit, and a second end of the $n^{th}$ detection capacitor is connected to the first level input end. The step of acquiring the first mapping relation between the temperature of the $n^{th}$ analog-to-digital conversion circuit measured in advance and the parasitic capacitance value of the $n^{th}$ analog-to-digital conversion circuit may include: turning off all of the switching elements of the $n^{th}$ switching element, measuring the real-time capacitance values of the $n^{th}$ testing point in the case that the $n^{th}$ analog-to-digital conversion circuit is at different temperatures, determining differences between the real-time capacitance values and the capacitance value of the $n^{th}$ detection capacitor as the parasitic capacitance values of the $n^{th}$ analog-to-digital conversion circuit at different temperatures, and acquiring the first mapping relation between the temperature of the $n^{th}$ analog-to-digital conversion circuit and the parasitic capacitance value of the $n^{th}$ analog-to-digital conversion circuit in accordance with the parasitic capacitance values and the corresponding temperatures. In actual use, the first mapping relation may be acquired through detecting the parasitic capacitance values of the $n^{th}$ analog-to-digital conversion circuit at different temperatures.

According to the capacitance measurement method in the embodiments of the present disclosure, it is able to acquire the first mapping relation through measuring the parasitic capacitance values of the analog-to-digital conversion circuit at different temperatures.

In a possible embodiment of the present disclosure, the capacitance value measurement method further includes: setting a standard temperature of the display panel corresponding to the external compensation sense line connected to the $A^{th}$ switching element of the $n^{th}$ switching circuit; acquiring a capacitance difference between a parasitic capacitance value of the corresponding external compensation sense line measured at a real-time temperature of the display panel and a parasitic capacitance value of the corresponding external compensation sense line at the standard temperature of the display panel, and acquiring a second mapping relation between the capacitance difference and the real-time temperature of the display panel; and measuring a real-time temperature t1 at a position on the display panel spaced apart from the corresponding external compensation sense line by a distance within a predetermined range, and determining that a parasitic capacitance value C0 of the corresponding external compensation sense line at the standard temperature of the display panel is equal to CsA−ΔC2, where ΔC2 represents a capacitance difference corresponding to the real-time temperature t1 acquired in accordance with the second mapping relation.

In the case that the temperature surrounding the corresponding external compensation sense line on the display panel changes, it is necessary to compensate the parasitic capacitance value of the corresponding external compensation sense line, so as to take the calculated parasitic capacitance value of the corresponding external compensation sense line as the parasitic capacitance value of the external compensation sense line at the standard temperature of the display panel, thereby to eliminate the influence of the temperature on the external compensation sense line.

The capacitance value measurement method will be described hereinafter in conjunction with the embodiments.

The capacitance value measurement method in the embodiments of the present disclosure is used to measure the parasitic capacitance value of the external compensation sense line of the display device.

As shown in FIG. 3, the display device includes a display panel 30, a circuit board 31, a plurality of analog-to-digital conversion chips, a plurality of detection capacitors arranged on the circuit board 31, display driving circuits arranged in M columns on the display panel 30 (although not shown in FIG. 3, the display driving circuit in each column may include a plurality of the display driving unit circuits as shown in FIG. 1, or a plurality of display driving unit circuits of any other structure), and M external compensation sense lines (not shown in FIG. 3) arranged on the display panel 30, and each detection capacitor corresponds to one analog-to-digital conversion chip, where M is a positive integer. The display driving circuit in one column is connected to one of the external compensation sense lines. One analog-to-digital conversion circuit and a plurality of switching elements are arranged on each analog-to-digital conversion chip. A first end of each switching element is connected to one external compensation sense line, and a second end of the switching element is connected to the corresponding analog-to-digital conversion circuit. A first end of one detection capacitor is connected to second ends of the plurality of switching elements of the analog-to-digital conversion chip corresponding to the detection capacitor, and a second end of the one detection capacitor is connected to a ground end GND.

In actual use, the circuit board 31 may be a Printed Circuit Board (PCB). In the embodiment of FIG. 3, the reference sign "ADC1" represents a first analog-to-digital conversion chip, the reference sign "ADC2" represents a second analog-to-digital conversion chip, and the reference sign "ADCN" represents an $N^{th}$ analog-to-digital conversion chip, where N represents the number of the analog-to-digital conversion chips of the display device, and N is an integer greater than 2.

The first analog-to-digital conversion chip ADC1 is arranged on a first flexible circuit board COF1, the second analog-to-digital conversion chip ADC2 is arranged on a second flexible circuit board COF2, and the $N^{th}$ analog-to-digital conversion chip ADCN is arranged on an $N^{th}$ flexible circuit board COF2. Each flexible circuit board is arranged between the display panel 30 and the circuit board 31. Each analog-to-digital conversion chip corresponds to a plurality of external compensation sense lines, and an analog-to-digital conversion sub-circuit of each analog-to-digital conversion chip is connected to the plurality of external compensation sense lines through the plurality of switching elements on the analog-to-digital conversion chip.

In the embodiment of FIG. 3, the switching elements are arranged on the analog-to-digital conversion chip. However, in actual use, the switching elements may also be arranged on the display panel, i.e., positions of the switching elements will not be particularly defined herein.

In the embodiment of FIG. 3, the reference sign "CEXT1" represents a first detection capacitor, the reference sign "CEXT2" represents a second detection capacitor, and the reference sign "CEXTN" represents an $N^{th}$ detection capacitor.

In the embodiment of FIG. 3, each analog-to-digital conversion sub-circuit is connected to the corresponding external compensation sense line via a Metal Oxide Semiconductor (MOS) switch built in the analog-to-digital conversion sub-circuit, so as to enable the analog-to-digital conversion sub-circuit to detect a source voltage applied to a driving transistor at a source voltage detection stage. In FIG. 3, the reference signs of triangles represent the ground ends.

In the case that the display device includes the detection capacitors, the testing point may be located on the circuit board 31 (e.g., a PCB).

In a possible embodiment of the present disclosure, in the case that the display device does not include any detection capacitor, the testing point may be located on the flexible circuit board (on which the analog-to-digital conversion chip is arranged), or on the circuit board 31 (e.g., the PCB).

How to measure the parasitic capacitance value of the external compensation sense line corresponding to the first analog-to-digital conversion chip ADC1 will be described hereinafter by taking the first analog-to-digital conversion chip as an example.

Figure 4:
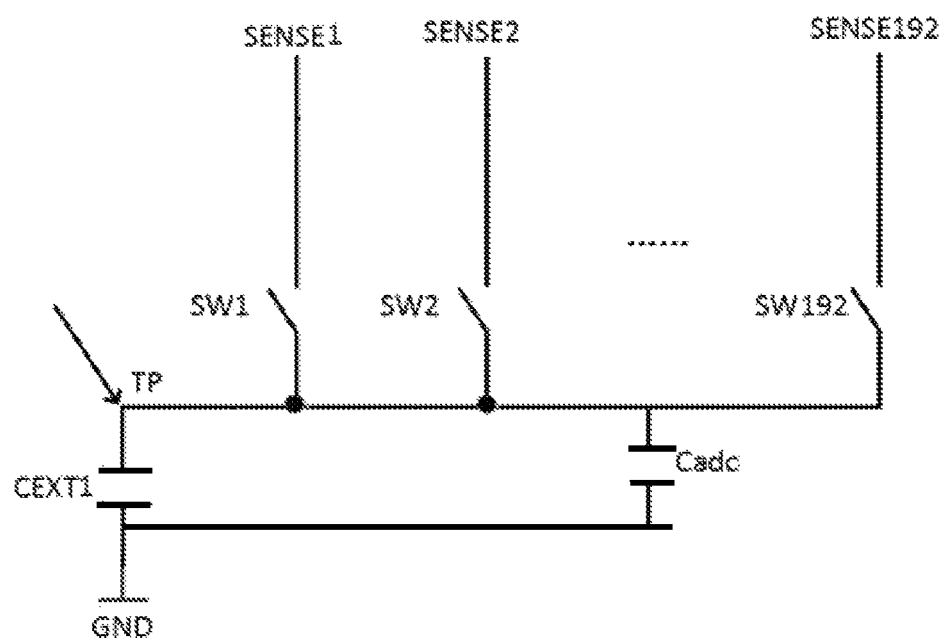
FIG. 4 is an equivalent capacitance diagram of the capacitance value measurement method according to one embodiment of the present disclosure.

As shown in FIG. 4, a first end of the first detection capacitor CEXT1 is connected to each of the second ends of the plurality of switching elements on the first analog-to-digital conversion chip ADC1 corresponding to the first detection capacitor CEXT1. In FIG. 4, the reference sign "SW1" represents a first switching element, the reference sign "SW2" represents a second switching element, and the reference sign "SW192" represents a $192^{nd}$ switching element, i.e., the first analog-to-digital conversion chip ADC1 includes 192 switching elements and each switching element is connected to a corresponding one of the external compensation sense lines. In FIG. 4, the reference sign "SENSE1" represents a first external compensation sense line, the reference sign "SENSE2" represents a second external compensation sense line, and the reference sign "SENSE192" represents a $192^{nd}$ external compensation sense line.

In actual use, the analog-to-digital conversion chip is equipped with a temperature sensor capable of monitoring in real time a temperature of the analog-to-digital conversion sub-circuit on the analog-to-digital conversion chip.

In FIG. 4, a first end of the first detection capacitor CEXT1 is connected to each of the second ends of the plurality of switching elements on the first analog-to-digital conversion chip ADC1 corresponding to the first detection capacitor CEXT1 via a connection line, and a first testing point TP1 is connected to the connection line.

In FIG. 4, the reference sign "Cadc" represents all of the parasitic capacitors located on the connection line and connected in parallel to the first detection capacitor CEXT1 other than parasitic capacitors located on the external compensation sense lines.

The parasitic capacitance values of the 192 external compensation sense lines corresponding to the first analog-to-digital conversion chip ADC1 may be measured as follows.

Figure 5:
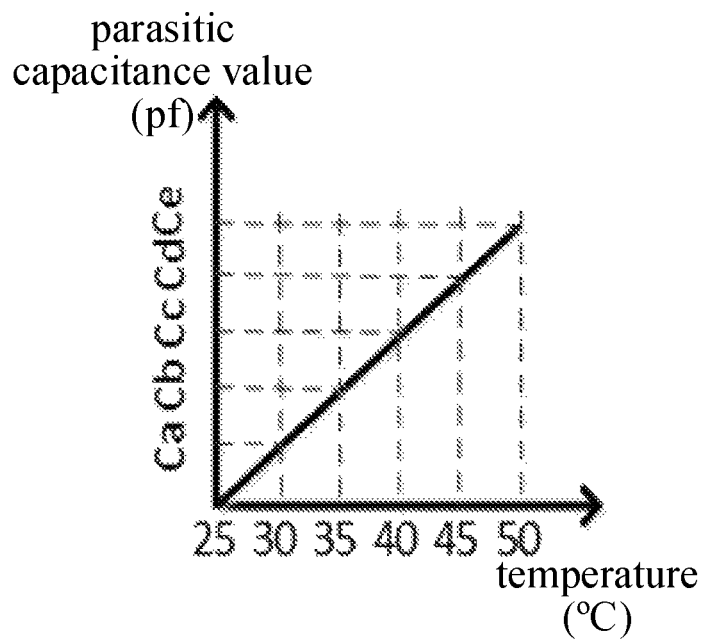
FIG. 5 is a schematic view showing parasitic capacitance values of an analog-to-digital conversion sub-circuit on a first analog-to-digital conversion chip ADC1 for each 5° C. change in temperature.

At first, the 192 switching elements on the first analog-to-digital conversion chip ADC1 are turned off (i.e., SW1 to SW192 in FIG. 4), and for example the first end of each CEXT is electrically disconnected from SENSE1 in the case that SW1 is turned off), so as to enable an Inductance Capacitance Resistance (LCR) testing probe to be in contact with the first testing point TP1, thereby to measure capacitance values C1 corresponding to different temperatures (i.e., the temperatures of the analog-to-digital conversion sub-circuit on ADC1). The capacitance value C1 is a sum of a capacitance value of CEXT1 and CAD1, i.e., the parasitic capacitance value Cad1 of ADC1 corresponding to each temperature is a difference between C1 and the capacitance value of CEXT1 measured at the temperature (CEXT1 is an external detection capacitor, and there is a very tiny change in capacitance value of CEXT1 along with the temperature, i.e., the capacitance value of CEXT1 is substantially not affected by the temperature). In other words, along with the change in the temperature of the analog-to-digital conversion sub-circuit on ADC1, a change in C1 is just a change in the parasitic capacitance value of ADC1. FIG. 5 shows the correspondence between the temperature T of the analog-to-digital conversion sub-circuit on ADC1 and the parasitic capacitance value of ADC1. As shown in FIG. 5, the temperature of the analog-to-digital conversion sub-circuit on ADC1 ranges from 25° C. to 50° C. (i.e., values indicated by a horizontal axis). The correspondence as shown in FIG. 5 may be acquired in accordance with the variations of the parasitic capacitance value of the analog-to-digital conversion sub-circuit on ADC1 with respect to each 5° C. change of the temperature. In FIG. 5, the reference sign "Ca" represents the parasitic capacitance value of the analog-to-digital conversion sub-circuit on ADC1 corresponding to the temperature of 30° C., the reference sign "Cb" represents the parasitic capacitance value of the analog-to-digital conversion sub-circuit on ADC1 corresponding to the temperature of 35° C., the reference sign "Cc" represents the parasitic capacitance value of the analog-to-digital conversion sub-circuit on ADC1 corresponding to the temperature of 40° C., the reference sign "Cd" represents the parasitic capacitance value of the analog-to-digital conversion sub-circuit on ADC1 corresponding to the temperature of 45° C., and the reference sign "Ce" represents the parasitic capacitance value of the analog-to-digital conversion sub-circuit on ADC1 corresponding to the temperature of 50° C.

Next, SW1 is turned on so as to measure a capacitance value C2_1 of the first testing point TP1, and at this time, the temperature of the analog-to-digital conversion sub-circuit on ADC1 is the standard temperature t0 of the analog-to-digital conversion circuit. The parasitic capacitance value Cs1 of the first external compensation sense line SENSE1 at the temperature t0 is equal to a difference between C2_1 and C1 acquired at t0.

Next, SW2 to SW192 are turned on sequentially so as to measure the capacitance values of the first testing point TP1. At this time, the variations in the parasitic capacitance values of ADC1 caused by the change in the temperature are taken into consideration.

For example, through measurement, it determines that the parasitic capacitance value of the first external compensation sense line SENSE1 is 600 pf at the temperature of 25° C., and the parasitic capacitance value Cs2 of the second external compensation sense line SENSE2 is 650 pf at the temperature of 30° C. At this time, it is necessary to subtract a variation in the parasitic capacitance value caused by the change in temperature from 650 pf. In the case that the difference between the parasitic capacitance value of the analog-to-digital conversion sub-circuit on ADC1 at 30° C. and the parasitic capacitance value of the analog-to-digital conversion sub-circuit on ADC1 at 25° C. is 5 pf, the exact parasitic capacitance value Cs2 of the second external compensation sense line SENSE2 shall be measured to be 645 pf (i.e., the parasitic capacitance value of SENSE2 at t0 is 645 pf).

The above measurement is performed in the case that the temperature inside the display panel is constant. In actual use, in the case that the temperature inside the display panel changes, the parasitic capacitance values of each external compensation sense line may be different from each other too.

During the implementation, in the case that the temperature inside the display panel changes, a standard temperature of the display panel T0 corresponding to the external compensation sense line connected to the $A^{th}$ switching element of the analog-to-digital conversion chip may be set at first. Next, a capacitance difference between a parasitic capacitance value of the corresponding external compensation sense line measured at a real-time temperature of the display panel and a parasitic capacitance value of the corresponding external compensation sense line measured at the standard temperature of the display panel is acquired, and a second mapping relation between the capacitance difference and the real-time temperature of the display panel may be acquired. Then, a real-time temperature t1 at a position on the display panel spaced apart from the corresponding external compensation sense line by a distance within a predetermined range may be measured, and a parasitic capacitance value C0 of the corresponding external compensation sense line at the standard temperature of the display panel may be determined to be equal to CsA−ΔC2, where ΔC2 represents a difference corresponding to the real-time temperature t1 acquired in accordance with the second mapping relation, and CsA is equal the parasitic capacitance value of the external compensation sense line connected to the $A^{th}$ switching element at the real-time temperature t of the analog-to-digital conversion sub-circuit.

In actual use, a temperature detection circuit may be arranged at a specific pixel position on the display panel, so as to extract, through an extractor, the real-time temperature at the specific pixel position and transmit it to a controller. During the implementation, the temperature detection circuit may not be limited to be arranged on the display panel, as long as it is capable of measuring the temperature at a position surrounding the specific external compensation sense line on the display panel.

For example, in the case that the parasitic capacitance value of the first external compensation sense line is measured to be 600 pf, the temperature at a position on the display panel spaced apart from the first external compensation sense line by a distance within a predetermined range is 40° C., and the standard temperature of the display panel corresponding to the first external compensation sense line is 25° C. In the case that the difference between the capacitance value corresponding to 25° C. and the capacitance value corresponding to 40° C. is 10 pf, the calibrated parasitic capacitance value of the first external compensation sense line (i.e., the parasitic capacitance value of the first external compensation sense line at the standard temperature of the display panel) is 590 pf.

Figure 6:
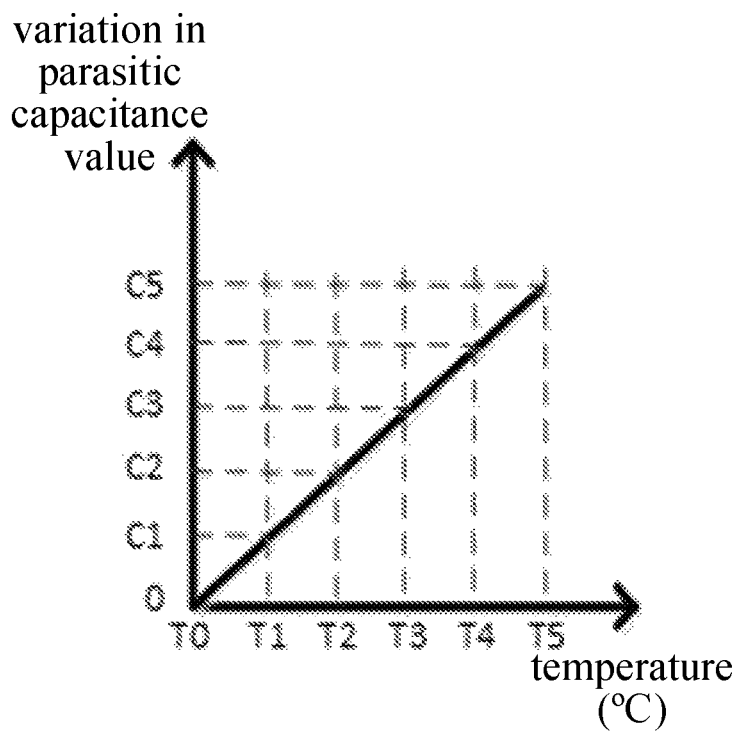
FIG. 6 is a schematic view showing a relation between a temperature at a position on a display panel spaced apart from a first external compensation sense line by a distance within a predetermined range and a change in a parasitic capacitance value of the first external compensation sense line.

As shown in FIG. 6, the horizontal axis represents the temperature at the position on the display panel spaced apart from the first external compensation sense line by a distance within a predetermined range, and the longitudinal axis represents a change in the parasitic capacitance value of the first external compensation sense line. The reference sign "T0" represents a reference temperature, the reference sign "T1" represents a first temperature, the reference sign "T2" represents a second temperature, the reference sign "T3" represents a third temperature, the reference sign "T4" represents a fourth temperature, and the reference sign "T5" represents a fifth temperature. In the case that the temperature at the position on the display panel spaced apart from the first external compensation sense line by the distance within the predetermined range is T1, a variation in the parasitic capacitance value of the first external compensation sense line (i.e., a difference between the parasitic capacitance value of the first external compensation sense line at T1 and the parasitic capacitance value of the first external compensation sense line at T0) is the first capacitance variation value C1. In the case that temperature at the position on the display panel spaced apart from the first external compensation sense line by the distance within the predetermined range is T2, a variation in the parasitic capacitance value of the first external compensation sense line (i.e., a difference between the parasitic capacitance value of the first external compensation sense line at T2 and the parasitic capacitance value of the first external compensation sense line at T0) is the second capacitance variation value C2. In the case that temperature at the position on the display panel spaced apart from the first external compensation sense line by the distance within the predetermined range is T3, a variation in the parasitic capacitance value of the first external compensation sense line (i.e., a difference between the parasitic capacitance value of the first external compensation sense line at T3 and the parasitic capacitance value of the first external compensation sense line at T0) is the third capacitance variation value C3. In the case that temperature at the position on the display panel spaced apart from the first external compensation sense line by the distance within the predetermined range is T4, a variation in the parasitic capacitance value of the first external compensation sense line (i.e., a difference between the parasitic capacitance value of the first external compensation sense line at T4 and the parasitic capacitance value of the first external compensation sense line at T0) is the fourth capacitance variation value C4. In the case that temperature at the position on the display panel spaced apart from the first external compensation sense line by the distance within the predetermined range is T5, a variation in the parasitic capacitance value of the first external compensation sense line (i.e., a difference between the parasitic capacitance value of the first external compensation sense line at T5 and the parasitic capacitance value of the first external compensation sense line at T0) is the fifth capacitance variation value C5.

Figure 7:
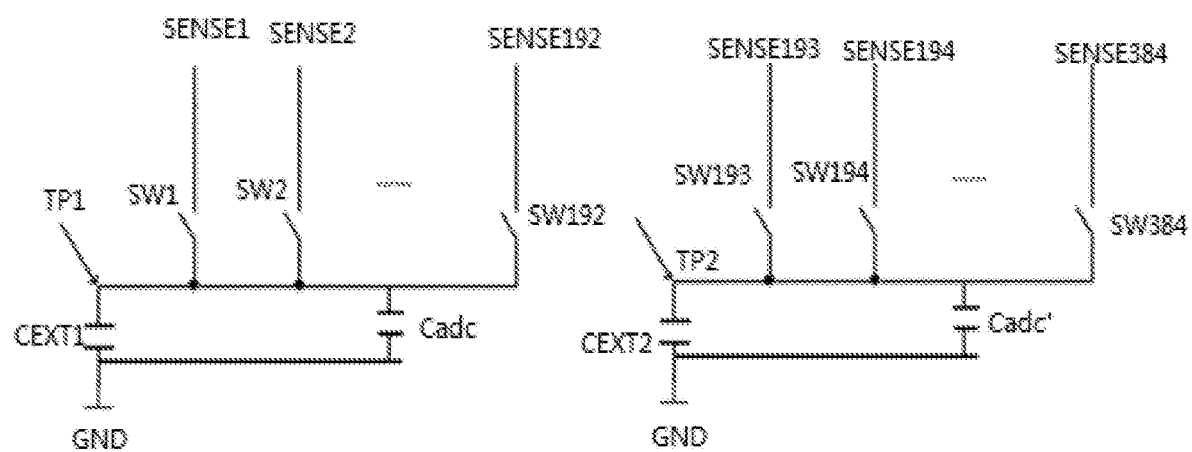
FIG. 7 is a schematic view showing a connection mode between a switching element on the first analog-to-digital conversion chip ADC1 and a corresponding first detection capacitor, and a connection mode between a switching element on the first analog-to-digital conversion chip ADC1 and a corresponding second detection capacitor.

FIG. 7 shows the connection relation between the switching elements on the first analog-to-digital conversion chip ADC1 and the corresponding first detection capacitor CEXT1, and the connection relation between the switching elements on the second analog-to-digital conversion chip ADC2 and the corresponding second detection capacitor CEXT2.

In FIG. 7, the reference sign "SW1" represents the first switching element, the reference sign "SW2" represents a second switching element, the reference sign "SW192" represents the $192^{nd}$ switching element, the reference sign "SENSE1" represents the first external compensation sense line, the reference sign "SENSE2" represents the second external compensation sense line, the reference sign "SENSE192" represents the $192^{nd}$ external compensation sense line, the reference sign "SW193" represents a $193^{rd}$ switching element, the reference sign "SW194" represents a $194^{th}$ switching element, the reference sign "SW384" represents a $384^{th}$ switching element, the reference sign "SENSE193" represents a $193^{rd}$ external compensation sense line, the reference sign "SENSE194" represents a $194^{th}$ external compensation sense line, the reference sign "SENSE384" represents a $384^{th}$ external compensation sense line, the reference sign "TP1" represents the first testing point, the reference sign "TP2" represents a second testing point, the reference sign "Cadc" represents all parasitic capacitors located on the first connection line and connected in parallel to CEXT1 other than the parasitic capacitors on the corresponding external compensation sense lines, and the reference sign "Cadc'" represents all parasitic capacitors located on a second connection line and connected in parallel to CEXT2 other than the parasitic capacitors on the corresponding external compensation sense lines. The first connection line is connected between the first end of the first detection capacitor CEXT1 and the second ends of the switching elements on ADC1, and the second connection line is connected between the first end of the second detection capacitor CEXT2 and the second ends of the switching elements on ADC2.

The present disclosure further provides in some embodiments a capacitance value measurement device for measuring a parasitic capacitance value of an external compensation sense line of a display device. The display device includes a display panel, a circuit board, N analog-to-digital conversion circuits, N switching circuits, and M external compensation sense lines arranged on the display panel, where each of N and M is a positive integer. An $n^{th}$ switching circuit of the N switching circuits is connected to an $n^{th}$ analog-to-digital conversion circuit of the N analog-to-digital conversion circuits. The $n^{th}$ switching circuit includes at least one switching element. A first end of one switching element of the $n^{th}$ switching circuit is connected to one of the external compensation sense lines, and a second end of the $n^{th}$ switching circuit is connected to the $n^{th}$ analog-to-digital conversion circuit, where n is a positive integer smaller than or equal to N. The capacitance value measurement device includes: a first mapping relation acquisition circuit configured to acquire a first mapping relation between a temperature of the $n^{th}$ analog-to-digital conversion circuit measured in advance and a parasitic capacitance value of the $n^{th}$ analog-to-digital conversion circuit; a first setting circuit configured to set a standard temperature t0 of one of the analog-to-digital conversion circuits; a switching control circuit configured to turn off all of the switching elements of the $n^{th}$ switching circuit other than an $A^{th}$ switching element, and turn on the $A^{th}$ switching element; a first temperature measurement circuit configured to measure a real-time temperature t of an analog-to-digital conversion sub-circuit of the analog-to-digital conversion circuit of the $n^{th}$ switching circuit; a capacitance value measurement circuit configured to measure a real-time capacitance value Cn of an $n^{th}$ testing point; and a first parasitic capacitance value determination circuit configured to acquire a parasitic capacitance value CsA of the external compensation sense line connected to the $A^{th}$ switching element at the real-time temperature t of the analog-to-digital conversion sub-circuit in accordance with the real-time capacitance value Cn and the first mapping relation. The $n^{th}$ analog-to-digital conversion circuit is connected to a second end of each switching element of the $n^{th}$ switching circuit via a connection line on which the $n^{th}$ testing point is located, where A is a positive integer.

According to the capacitance value measurement device in the embodiments of the present disclosure, the first mapping relation between the temperature of the $n^{th}$ analog-to-digital conversion circuit measured in advance and the parasitic capacitance value of the $n^{th}$ analog-to-digital conversion circuit is acquired at first, and then the parasitic capacitance value of the external compensation sense line is accurately acquired in accordance with the first mapping relation, the measured real-time capacitance value Cn of the $n^{th}$ testing point, and the real-time temperature t of the analog-to-digital conversion sub-circuit of the $n^{th}$ analog-to-digital conversion circuit. As a result, it is able to accurately measure an actual parasitic capacitance value of the external compensation sense line in accordance with the influence of the different real-time temperatures of the analog-to-digital conversion sub-circuit on the parasitic capacitance value of the analog-to-digital conversion circuit.

In actual use, the capacitance value measurement device further includes at least one analog-to-digital conversion chip. The $n^{th}$ analog-to-digital conversion circuit and the $n^{th}$ switching circuit are arranged on the analog-to-digital conversion chip, or the $n^{th}$ analog-to-digital conversion circuit is arranged on the analog-to-digital conversion chip and the $n^{th}$ switching circuit is arranged on the display panel.

To be specific, the first parasitic capacitance value determination circuit is further configured to acquire a first parasitic capacitance value Cad1 of the $n^{th}$ analog-to-digital conversion circuit corresponding to the standard temperature t0 of the analog-to-digital conversion circuit in accordance with the first mapping relation, acquire a difference ΔC1 between a second parasitic capacitance value of the $n^{th}$ analog-to-digital conversion circuit corresponding to the real-time temperature t of the analog-to-digital conversion sub-circuit and the first parasitic capacitance value Cad1, and determine that the parasitic capacitance value CsA of the external compensation sense line connected to the $A^{th}$ switching element at the real-time temperature t of the analog-to-digital conversion sub-circuit is equal to Cn−Cad1−ΔC1.

To be specific, the display device further includes N detection capacitors arranged on the circuit board. An $n^{th}$ detection capacitor corresponds to an $n^{th}$ analog-to-digital conversion chip. A first end of an $n^{th}$ detection capacitor of the N detection capacitors is connected to the second ends of the switching elements of the $n^{th}$ switching circuit, and a second end of the $n^{th}$ detection capacitor is connected to a first level input end. The first parasitic capacitance value determination circuit is further configured to acquire a first parasitic capacitance value Cad1 of the $n^{th}$ analog-to-digital conversion circuit corresponding to the standard temperature t0 of the analog-to-digital conversion circuit in accordance with the first mapping relation, acquire a difference ΔC1 between a second parasitic capacitance value of the $n^{th}$ analog-to-digital conversion circuit corresponding to the real-time temperature t of the analog-to-digital conversion sub-circuit and the first parasitic capacitance value Cad1, and determine that the parasitic capacitance value CsA of the external compensation sense line connected to the $A^{th}$ switching element at the real-time temperature t of the analog-to-digital conversion sub-circuit is equal to Cn−Cad1−Cextn−ΔC1, where Cextn represents a capacitance value of the $n^{th}$ detection capacitor.

In actual use, the first level input end may be a ground end, or any other direct-current voltage input end.

To be specific, the switching control circuit is further configured to: turn on a plurality of switching elements of the $n^{th}$ switching circuit in a time-division manner; and in the case that one switching element of the $n^{th}$ switching circuit has been turned on by the switching control circuit, turn off all of the switching elements of the $n^{th}$ switching circuit other than the switching element that has been turned on. The standard temperature t0 of the analog-to-digital conversion circuit is a temperature of the $n^{th}$ analog-to-digital conversion circuit measured in the case that an $a^{th}$ switching element of the $n^{th}$ switching circuit has been turned on, a is a positive integer, and the $a^{th}$ switching element is a switching element of the $n^{th}$ switching circuit which is turned on prior to turning on any other one of the switching elements of the $n^{th}$ switching circuit.

During the implementation, the switching control circuit may be further configured to: turn on a plurality of switching elements of the $n^{th}$ switching circuit sequentially in a time-division manner; and in the case that one switching element of the switching elements of the $n^{th}$ switching circuit has been turned on by the switching control circuit, turn off all of the switching elements of the $n^{th}$ switching circuit other than the switching element that has been turned on. The standard temperature t0 of the analog-to-digital conversion circuit is a temperature of the $n^{th}$ analog-to-digital conversion circuit measured in the case that a first switching element of the switching circuit has been turned on.

In actual use, the capacitance value measurement device may further include a first mapping relation detection circuit. The first mapping relation detection circuit includes: a second control circuit configured to turn off all of the switching elements of the $n^{th}$ switching circuit; a real-time capacitance value measurement circuit configured to measure the real-time capacitance values of the $n^{th}$ testing point in the case that the $n^{th}$ analog-to-digital conversion circuit is at different temperatures; a parasitic capacitance value determination circuit configured to determine the real-time capacitance values as the parasitic capacitance values of the $n^{th}$ analog-to-digital conversion circuit at different temperatures; and a first mapping relation detection circuit configured to acquire the first mapping relation between the temperature of the $n^{th}$ analog-to-digital conversion circuit and the parasitic capacitance value of the $n^{th}$ analog-to-digital conversion circuit in accordance with the parasitic capacitance values and the corresponding temperatures.

To be specific, the display device may further include N detection capacitors arranged on the circuit board. An $n^{th}$ detection capacitor corresponds to an $n^{th}$ analog-to-digital conversion chip. A first end of the $n^{th}$ detection capacitor is connected to second ends of the plurality of switching elements of the $n^{th}$ switching circuit, and a second end of the $n^{th}$ detection capacitor is connected to the first level input end. The capacitance value measurement device may further include a first mapping relation detection circuit. The first mapping relation detection circuit includes: a second control circuit configured to turn off all of the switching elements of the $n^{th}$ switching element; a real-time capacitance value measurement circuit configured to measure the real-time capacitance values of the $n^{th}$ testing point in the case that the $n^{th}$ analog-to-digital conversion circuit is at different temperatures; a parasitic capacitance value determination circuit configured to determine differences between the real-time capacitance values and the capacitance value of the $n^{th}$ detection capacitor as the parasitic capacitance values of the $n^{th}$ analog-to-digital conversion circuit at different temperatures; and a first mapping relation detection circuit configured to acquire the first mapping relation between the temperature of the $n^{th}$ analog-to-digital conversion circuit and the parasitic capacitance value of the $n^{th}$ analog-to-digital conversion circuit in accordance with the parasitic capacitance values and the corresponding temperatures.

In a possible embodiment of the present disclosure, the capacitance value measurement device further includes: a second setting circuit configured to set a standard temperature of the display panel corresponding to the corresponding external compensation sense line connected to the $A^{th}$ switching element of the $n^{th}$ switching circuit; a second mapping relation acquisition circuit configured to acquire a capacitance difference between a parasitic capacitance value of the corresponding external compensation sense line measured at a real-time temperature of the display panel and a parasitic capacitance value of the corresponding external compensation sense line at the standard temperature of the display panel, and acquire a second mapping relation between the capacitance difference and the real-time temperature of the display panel; a second temperature measurement circuit configured to measure a real-time temperature t1 at a position on the display panel spaced apart from the corresponding external compensation sense line by a distance within a predetermined range; and a second parasitic capacitance value determination circuit configured to determine that a parasitic capacitance value C0 of the corresponding external compensation sense line at the standard temperature of the display panel is equal to CsA−ΔC2, where ΔC2 represents a capacitance difference corresponding to the real-time temperature t1 acquired in accordance with the second mapping relation.

In the case that the temperature surrounding the corresponding external compensation sense line on the display panel changes, it is necessary to compensate the parasitic capacitance value of the corresponding external compensation sense line, so as to take the calculated parasitic capacitance value of the corresponding external compensation sense line as the parasitic capacitance value of the external compensation sense line at the standard temperature of the display panel, thereby to eliminate the influence of the temperature on the external compensation sense line.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A capacitance value measurement method for measuring a parasitic capacitance value of an external compensation sense line of a display device,
wherein the display device comprises a display panel, a circuit board, N analog-to-digital conversion circuits, N switching circuits, and M external compensation sense lines arranged on the display panel, where each of N and M is a positive integer,
an $n^{th}$ switching circuit of the N switching circuits is connected to an $n^{th}$ analog-to-digital conversion circuit of the N analog-to-digital conversion circuits,
the $n^{th}$ switching circuit comprises at least one switching element,
a first end of one of the at least one switching element of the $n^{th}$ switching circuit is connected to one of the external compensation sense lines, and a second end of the one switching element is connected to the $n^{th}$ analog-to-digital conversion circuit, where n is a positive integer smaller than or equal to N,
wherein the capacitance value measurement method comprises:
acquiring a first mapping relation between temperatures of the $n^{th}$ analog-to-digital conversion circuit measured in advance and parasitic capacitance values of the $n^{th}$ analog-to-digital conversion circuit;
setting a standard temperature t0 of one of the analog-to-digital conversion circuits; and
turning off all of the at least one switching element of the $n^{th}$ switching circuit other than an $A^{th}$ switching element, turning on the $A^{th}$ switching element, measuring a real-time temperature t of an analog-to-digital conversion sub-circuit of the $n^{th}$ analog-to-digital conversion circuit, measuring a real-time capacitance value Cn of an $n^{th}$ testing point, and acquiring a parasitic capacitance value CsA of the external compensation sense line connected to the $A^{th}$ switching element at the real-time temperature t of the analog-to-digital conversion sub-circuit in accordance with the real-time capacitance value Cn and the first mapping relation,
wherein a connection line is provided between the $n^{th}$ analog-to-digital conversion circuit and a second end of each of the at least one switching element of the $n^{th}$ switching circuit, and the $n^{th}$ testing point is located on the connection line, where A is a positive integer.

2. The capacitance value measurement method according to claim 1, wherein the step of acquiring the parasitic capacitance value CsA of the external compensation sense line connected to the $A^{th}$ switching element at the real-time temperature t of the analog-to-digital conversion sub-circuit in accordance with the real-time capacitance value Cn and the first mapping relation comprises:
acquiring a first parasitic capacitance value Cad1 of the $n^{th}$ analog-to-digital conversion circuit corresponding to the standard temperature t0 of the analog-to-digital conversion circuit in accordance with the first mapping relation, acquiring a difference $\Delta C1$ between a second parasitic capacitance value of the $n^{th}$ analog-to-digital conversion circuit corresponding to the real-time temperature t of the analog-to-digital conversion sub-circuit and the first parasitic capacitance value Cad1, and determining that the parasitic capacitance value CsA of the external compensation sense line connected to the $A^{th}$ switching element at the real-time temperature t of the analog-to-digital conversion sub-circuit is equal to Cn−Cad1−$\Delta C1$.

3. The capacitance value measurement method according to claim 1, wherein the display device further comprises N detection capacitors arranged on the circuit board, a first end of an $n^{th}$ detection capacitor of the N detection capacitors is connected to the second end of each of a plurality of switching elements of the $n^{th}$ switching circuit, and a second end of the $n^{th}$ detection capacitor is connected to a first level input end,
wherein the step of acquiring the parasitic capacitance value CsA of the external compensation sense line connected to the $A^{th}$ switching element at the real-time temperature t of the analog-to-digital conversion sub-circuit in accordance with the real-time capacitance value Cn and the first mapping relation comprises:
acquiring a first parasitic capacitance value Cad1 of the $n^{th}$ analog-to-digital conversion circuit corresponding to the standard temperature t0 of the analog-to-digital conversion circuit in accordance with the first mapping relation, acquiring a difference $\Delta C1$ between a second parasitic capacitance value of the $n^{th}$ analog-to-digital conversion circuit corresponding to the real-time temperature t of the analog-to-digital conversion sub-circuit and the first parasitic capacitance value Cad1, and determining that the parasitic capacitance value CsA of the external compensation sense line connected to the $A^{th}$ switching element at the real-time temperature t of the analog-to-digital conversion sub-circuit is equal to Cn−Cad1−Cextn−$\Delta C1$, where Cextn represents a capacitance value of the $n^{th}$ detection capacitor.

4. The capacitance value measurement method according to claim 2, wherein the step of turning off all of the at least one switching element of the $n^{th}$ switching circuit other than the $A^{th}$ switching element and turning on the $A^{th}$ switching element comprises:
turning on a plurality of switching elements of the $n^{th}$ switching circuit in a time-division manner; and
in the case that one of the switching elements of the $n^{th}$ switching circuit has been turned on, turning off all of the switching elements of the $n^{th}$ switching circuit other than the switching element that has been turned on,
wherein the standard temperature t0 of the analog-to-digital conversion circuit is a temperature of the $n^{th}$ analog-to-digital conversion circuit measured in the case that an $a^{th}$ switching element of the $n^{th}$ switching circuit has been turned on, a is a positive integer, and the $a^{th}$ switching element is one of the switching elements of the $n^{th}$ switching circuit which is turned on prior to turning on any other one of the switching elements of the $n^{th}$ switching circuit.

5. The capacitance value measurement method according to claim 2, wherein the step of turning off all of the at least one switching element of the $n^{th}$ switching circuit other than the $A^{th}$ switching element and turning on the $A^{th}$ switching element comprises:
turning on a plurality of switching elements of the $n^{th}$ switching circuit sequentially in a time-division manner; and
in the case that one of the switching elements has been turned on, turning off all of the switching elements of the $n^{th}$ switching circuit other than the switching element that has been turned on, wherein the standard temperature t0 of the analog-to-digital conversion circuit is a temperature of the $n^{th}$ analog-to-digital conversion circuit measured in the case that a first switching element of the $n^{th}$ switching circuit has been turned on.

6. The capacitance value measurement method according to claim 2, wherein the step of acquiring the first mapping relation between the temperatures of the $n^{th}$ analog-to-digital conversion circuit measured in advance and the parasitic capacitance values of the $n^{th}$ analog-to-digital conversion circuit comprises:

turning off all of the at least one switching element of the $n^{th}$ switching circuit, measuring the real-time capacitance values of the $n^{th}$ testing point in the case that the $n^{th}$ analog-to-digital conversion circuit is at different temperatures, determining the real-time capacitance values as the parasitic capacitance values of the $n^{th}$ analog-to-digital conversion circuit at different temperatures, and acquiring the first mapping relation between the temperatures of the $n^{th}$ analog-to-digital conversion circuit and the parasitic capacitance values of the $n^{th}$ analog-to-digital conversion circuit in accordance with the parasitic capacitance values and the corresponding temperatures.

7. The capacitance value measurement method according to claim 3, wherein the step of acquiring the first mapping relation between the temperatures of the $n^{th}$ analog-to-digital conversion circuit measured in advance and the parasitic capacitance values of the $n^{th}$ analog-to-digital conversion circuit comprises:

turning off all of the switching elements of the $n^{th}$ switching circuit, measuring the real-time capacitance values of the $n^{th}$ testing point in the case that the $n^{th}$ analog-to-digital conversion circuit is at different temperatures, determining differences between the real-time capacitance values and the capacitance value of the $n^{th}$ detection capacitor as the parasitic capacitance values of the $n^{th}$ analog-to-digital conversion circuit at different temperatures, and acquiring the first mapping relation between the temperatures of the $n^{th}$ analog-to-digital conversion circuit and the parasitic capacitance values of the $n^{th}$ analog-to-digital conversion circuit in accordance with the parasitic capacitance values and the corresponding temperatures.

8. The capacitance value measurement method according to claim 2, further comprising:

setting a standard temperature of the display panel corresponding to the external compensation sense line connected to the $A^{th}$ switching element of the $n^{th}$ switching circuit;

acquiring a capacitance difference between a parasitic capacitance value of the corresponding external compensation sense line measured at a real-time temperature of the display panel and a parasitic capacitance value of the corresponding external compensation sense line at the standard temperature of the display panel, and acquiring a second mapping relation between the capacitance difference and the real-time temperature of the display panel; and measuring a real-time temperature t1 at a position on the display panel spaced apart from the corresponding external compensation sense line by a distance within a predetermined range, and determining that a parasitic capacitance value C0 of the corresponding external compensation sense line at the standard temperature of the display panel is equal to CsA−ΔC2, where ΔC2 represents a capacitance difference corresponding to the real-time temperature t1 acquired in accordance with the second mapping relation.

9. The capacitance value measurement method according to claim 3, wherein the step of turning off all of the at least one element of the $n^{th}$ switching circuit other than the $A^{th}$ switching element and turning on the $A^{th}$ switching element comprises:

turning on the plurality of switching elements of the $n^{th}$ switching circuit in a time-division manner; and in the case that one of the switching elements of the $n^{th}$ switching circuit has been turned on, turning off all of the switching elements of the $n^{th}$ switching circuit other than the switching element that has been turned on, wherein the standard temperature t0 of the analog-to-digital conversion circuit is a temperature of the $n^{th}$ analog-to-digital conversion circuit measured in the case that an $a^{th}$ switching element of the $n^{th}$ switching circuit has been turned on, a is a positive integer, and the $a^{th}$ switching element is a switching element of the $n^{th}$ switching circuit which is turned on prior to turning on any other one of the switching elements of the $n^{th}$ switching circuit.

10. The capacitance value measurement method according to claim 3, wherein the step of turning off all of the at least one switching element of the $n^{th}$ switching circuit other than the $A^{th}$ switching element and turning on the $A^{th}$ switching element comprises:

turning on the plurality of switching elements of the $n^{th}$ switching circuit sequentially in a time-division manner; and in the case that one of the switching elements has been turned on, turning off all of the switching elements of the $n^{th}$ switching circuit other than the switching element that has been turned on, wherein the standard temperature t0 of the analog-to-digital conversion circuit is a temperature of the $n^{th}$ analog-to-digital conversion circuit measured in the case that a first switching element of the $n^{th}$ switching circuit has been turned on.

11. A capacitance value measurement device for measuring a parasitic capacitance value of an external compensation sense line of a display device, wherein the display device comprises a display panel, a circuit board, N analog-to-digital conversion circuits, N switching circuits, and M external compensation sense lines arranged on the display panel, where each of N and M is a positive integer, an $n^{th}$ switching circuit of the N switching circuits is connected to an $n^{th}$ analog-to-digital conversion circuit of the N analog-to-digital conversion circuits, the $n^{th}$ switching circuit comprises at least one switching element, a first end of one of the at least one switching element of the $n^{th}$ switching circuit is connected to one of the external compensation sense lines, and a second end of the one switching element is connected to the $n^{th}$ analog-to-digital conversion circuit, where n is a positive integer smaller than or equal to N, wherein the capacitance value measurement device comprises:

a first mapping relation acquisition circuit configured to acquire a first mapping relation between temperatures of the $n^{th}$ analog-to-digital conversion circuit measured in advance and parasitic capacitance values of the $n^{th}$ analog-to-digital conversion circuit;

a first setting circuit configured to set a standard temperature t0 of one of the analog-to-digital conversion circuits;

a switching control circuit configured to turn off each of the at least one switching element of the $n^{th}$ switching circuit other than an $A^{th}$ switching element, and turn on the $A^{th}$ switching element;

a first temperature measurement circuit configured to measure a real-time temperature t of an analog-to-digital conversion sub-circuit of the $n^{th}$ analog-to-digital conversion circuit;

a capacitance value measurement circuit configured to measure a real-time capacitance value Cn of an $n^{th}$ testing point; and a first parasitic capacitance value determination circuit configured to acquire a parasitic capacitance value CsA of the external compensation sense line connected to the $A^{th}$ switching element at the real-time temperature t of the analog-to-digital conversion sub-circuit in accordance with the real-time capacitance value Cn and the first mapping relation, wherein a connection line is provided between the $n^{th}$ analog-to-digital conversion circuit and a second end of each of the at least one switching element of the $n^{th}$ switching circuit, and the $n^{th}$ testing point is located on the connection line, where A is a positive integer.

12. The capacitance value measurement device according to claim 11, further comprising at least one analog-to-digital conversion chip, wherein both the $n^{th}$ analog-to-digital conversion circuit and the $n^{th}$ switching circuit are arranged on the analog-to-digital conversion chip; or the $n^{th}$ analog-to-digital conversion circuit is arranged on the analog-to-digital conversion chip and the $n^{th}$ switching circuit is arranged on the display panel.

13. The capacitance value measurement device according to claim 11, wherein the first parasitic capacitance value determination circuit is further configured to:

acquire a first parasitic capacitance value Cad1 of the $n^{th}$ analog-to-digital conversion circuit corresponding to the standard temperature t0 of the analog-to-digital conversion circuit in accordance with the first mapping relation, acquire a difference $\Delta C1$ between a second parasitic capacitance value of the $n^{th}$ analog-to-digital conversion circuit corresponding to the real-time temperature t of the analog-to-digital conversion sub-circuit and the first parasitic capacitance value Cad1, and determine that the parasitic capacitance value CsA of the external compensation sense line connected to the $A^{th}$ switching element at the real-time temperature t of the analog-to-digital conversion sub-circuit is equal to Cn−Cad1−$\Delta C1$.

14. The capacitance value measurement device according to claim 11, wherein the display device further comprises N detection capacitors arranged on the circuit board, a first end of an $n^{th}$ detection capacitor of the N detection capacitors is connected to the second end of each of the at least one switching element of the $n^{th}$ switching circuit, and a second end of the $n^{th}$ detection capacitor is connected to a first level input end, wherein the first parasitic capacitance value determination circuit is further configured to:

acquire a first parasitic capacitance value Cad1 of the $n^{th}$ analog-to-digital conversion circuit corresponding to the standard temperature t0 of the analog-to-digital conversion circuit in accordance with the first mapping relation, acquire a difference $\Delta C1$ between a second parasitic capacitance value of the $n^{th}$ analog-to-digital conversion circuit corresponding to the real-time temperature t of the analog-to-digital conversion sub-circuit and the first parasitic capacitance value Cad1, and determine that the parasitic capacitance value CsA of the external compensation sense line connected to the $A^{th}$ switching element at the real-time temperature t of the analog-to-digital conversion sub-circuit is equal to Cn−Cad1−Cextn−$\Delta C1$, where Cextn represents a capacitance value of the $n^{th}$ detection capacitor.

15. The capacitance value measurement device according to claim 13, wherein the switching control circuit is further configured to:

turn on a plurality of switching elements of the $n^{th}$ switching circuit in a time-division manner; and in the case that one of the switching elements of the $n^{th}$ switching circuit has been turned on by the switching control circuit, turn off all of the switching elements of the $n^{th}$ switching circuit other than the switching element that has been turned on, wherein the standard temperature t0 of the analog-to-digital conversion circuit is a temperature of the $n^{th}$ analog-to-digital conversion circuit measured in the case that an $a^{th}$ switching element of the $n^{th}$ switching circuit has been turned on, a is a positive integer, and the $a^{th}$ switching element is one of the switching elements of the $n^{th}$ switching circuit which is turned on prior to turning on any other one of the switching elements of the $n^{th}$ switching circuit.

16. The capacitance value measurement device according to claim 13, wherein the switching control circuit is further configured to:

turn on a plurality of switching elements of the $n^{th}$ switching circuit sequentially in a time-division manner; and in the case that one of the switching elements of the $n^{th}$ switching circuit has been turned on by the switching control circuit, turn off all of the switching elements of the $n^{th}$ switching circuit other than the switching element that has been turned on, wherein the standard temperature t0 of the analog-to-digital conversion circuit is a temperature of the $n^{th}$ analog-to-digital conversion circuit measured in the case that a first switching element of the $n^{th}$ switching circuit has been turned on.

17. The capacitance value measurement device according to claim 13, further comprising a first mapping relation detection circuit, wherein the first mapping relation detection circuit comprises:

a second control circuit configured to turn off all of switching elements of the $n^{th}$ switching element;

a real-time capacitance value measurement circuit configured to measure the real-time capacitance values of the $n^{th}$ testing point in the case that the $n^{th}$ analog-to-digital conversion circuit is at different temperatures;

a parasitic capacitance value determination circuit configured to determine the real-time capacitance values as the parasitic capacitance values of the $n^{th}$ analog-to-digital conversion circuit at different temperatures; and a first mapping relation detection circuit configured to acquire the first mapping relation between the temperatures of the $n^{th}$ analog-to-digital conversion circuit and the parasitic capacitance values of the $n^{th}$ analog-to-digital conversion circuit in accordance with the parasitic capacitance values and the corresponding temperatures.

18. The capacitance value measurement device according to claim 14, further comprising a first mapping relation detection circuit, wherein the first mapping relation detection circuit comprises:
a second control circuit configured to turn off all of switching elements of the $n^{th}$ switching circuit;
a real-time capacitance value measurement circuit configured to measure the real-time capacitance values of the $n^{th}$ testing point in the case that the $n^{th}$ analog-to-digital conversion circuit is at different temperatures;
a parasitic capacitance value determination circuit configured to determine differences between the real-time capacitance values and the capacitance value of the $n^{th}$ detection capacitor as the parasitic capacitance values of the $n^{th}$ analog-to-digital conversion circuit at different temperatures; and
a first mapping relation detection circuit configured to acquire the first mapping relation between the temperatures of the $n^{th}$ analog-to-digital conversion circuit and the parasitic capacitance values of the $n^{th}$ analog-to-digital conversion circuit in accordance with the parasitic capacitance values and the corresponding temperatures.

19. The capacitance value measurement device according to claim 13, further comprising:
a second setting circuit configured to set a standard temperature of the display panel corresponding to the external compensation sense line connected to the $A^{th}$ switching element of the $n^{th}$ switching circuit;
a second mapping relation acquisition circuit configured to acquire a capacitance difference between a parasitic capacitance value of the corresponding external compensation sense line measured at a real-time temperature of the display panel and a parasitic capacitance value of the corresponding external compensation sense line at the standard temperature of the display panel, and acquire a second mapping relation between the capacitance difference and the real-time temperature of the display panel;
a second temperature measurement circuit configured to measure a real-time temperature t1 at a position on the display panel spaced apart from the corresponding external compensation sense line by a distance within a predetermined range; and
a second parasitic capacitance value determination circuit configured to determine that a parasitic capacitance value C0 of the corresponding external compensation sense line at the standard temperature of the display panel is equal to CsA−ΔC2, where ΔC2 represents a capacitance difference corresponding to the real-time temperature t1 acquired in accordance with the second mapping relation.

20. The capacitance value measurement device according to claim 14, wherein the switching control circuit is further configured to:
turn on a plurality of switching elements of the $n^{th}$ switching circuit in a time-division manner; and
in the case that one of the switching elements of the $n^{th}$ switching circuit has been turned on by the switching control circuit, turn off all of the switching elements of the $n^{th}$ switching circuit other than the switching element that has been turned on,
wherein the standard temperature t0 of the analog-to-digital conversion circuit is a temperature of the $n^{th}$ analog-to-digital conversion circuit measured in the case that an $a^{th}$ switching element of the $n^{th}$ switching circuit has been turned on, a is a positive integer, and the $a^{th}$ switching element is one of the switching elements of the $n^{th}$ switching circuit prior to turning on any other one of the switching elements of the $n^{th}$ switching circuit.

* * * * *